(12) United States Patent
Wang et al.

(10) Patent No.: US 10,885,853 B2
(45) Date of Patent: Jan. 5, 2021

(54) SHIFT REGISTER AND METHOD FOR DRIVING THE SAME, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Ying Wang, Beijing (CN); Meng Li, Beijing (CN); Hongmin Li, Beijing (CN); Dong Wang, Beijing (CN); Fengjing Tang, Beijing (CN)

(73) Assignees: BOE TECHNOLOGY GROUP CO., LTD., Beijing (CN); HEFIE BOE OPTOELECTRONICS TECHNOLOGY CO., LTD., Anhui (CN)

( * ) Notice: Subject to any disclaimer, the term of this patent is extended or adjusted under 35 U.S.C. 154(b) by 78 days.

(21) Appl. No.: 16/205,305

(22) Filed: Nov. 30, 2018

(65) Prior Publication Data

US 2019/0237023 A1 Aug. 1, 2019

(30) Foreign Application Priority Data

Jan. 31, 2018 (CN) .......................... 2018 1 0099598

(51) Int. Cl.
*G09G 3/36* (2006.01)
*G09G 3/3266* (2016.01)
*G11C 19/28* (2006.01)

(52) U.S. Cl.
CPC ......... *G09G 3/3266* (2013.01); *G09G 3/3677* (2013.01); *G11C 19/28* (2013.01); *G09G 2310/0286* (2013.01); *G09G 2310/06* (2013.01)

(58) Field of Classification Search
CPC .......................... G09G 3/3266; G09G 3/3677
(Continued)

(56) References Cited

U.S. PATENT DOCUMENTS 10,510,428 B2 * 12/2019 Wang ..................... G11C 19/28
2007/0052653 A1 3/2007 Shin
(Continued)

FOREIGN PATENT DOCUMENTS

CN 101853705 A 10/2010
CN 102930814 A 2/2013
(Continued)

OTHER PUBLICATIONS

First Office Action for Chinese Patent Application No. 201810099598.2, dated Mar. 24, 2020.

*Primary Examiner* — Calvin C Ma
(74) *Attorney, Agent, or Firm* — Calfee, Halter & Griswold LLP

(57) ABSTRACT

A shift register and a method for driving the same, a gate driving circuit and a display device. The shift register includes: an input sub-circuit configured to provide a signal at the signal input terminal to the pull-up node under control of the first clock signal terminal; an output sub-circuit configured to provide a clock signal at the second clock signal terminal to the signal output terminal under control of the pull-up node; and a pull-down sub-circuit configured to provide a signal at the power supply terminal to the signal output terminal under control of the third clock signal terminal.

16 Claims, 7 Drawing Sheets

(58) Field of Classification Search
USPC .................................................. 345/87, 208
See application file for complete search history.

(56) References Cited

U.S. PATENT DOCUMENTS

| | | | |
|---|---|---|---|
| 2015/0255031 A1* | 9/2015 | Cao ........................ | G11C 19/28 345/210 |
| 2015/0318052 A1* | 11/2015 | Li ........................... | G11C 19/28 377/64 |

FOREIGN PATENT DOCUMENTS

| | | | |
|---|---|---|---|
| CN | 104715710 A | 6/2015 | |
| CN | 105448269 A | 3/2016 | |
| CN | 106057161 A | 10/2016 | |
| CN | 106898322 A | 6/2017 | |
| KR | 20000059298 A | 10/2000 | |

\* cited by examiner

SHIFT REGISTER AND METHOD FOR DRIVING THE SAME, GATE DRIVING CIRCUIT AND DISPLAY DEVICE

CROSS-REFERENCE TO RELATED APPLICATIONS

This application claims priority to Chinese Patent Application 201810099598.2, filed Jan. 31, 2018, the entire contents of which are incorporated herein by reference.

TECHNICAL FIELD

The present disclosure relates to display technologies, and particularly to a shift register and a method for driving the same, a gate driving circuit and a display device.

BACKGROUND

In recent years, flat panel displays, such as Thin Film Transistor Liquid Crystal Display (TFT-LCD) and Active Matrix Organic Light Emitting Diode (AMOLED) have been widely applied in electronic products such as TVs and mobile phones, due to their light weight, thin thickness and low power consumption.

With the development of display technologies, high-resolution and narrow-frame display panels have become the trend of development. For this reason, the Gate Driver on Array (GOA) technology has emerged. The GOA technology directly integrates the gate driving circuit of a display panel on the array substrate of the display panel to replace the external driving chip, and has the advantages such as low cost, reduced processes, high productivity, and the like.

SUMMARY

In order to reduce the number of thin film transistors included in GOA circuits and improve the design space of display panels, embodiments of the present disclosure provide a shift register and a method for driving the same, a gate driving circuit and a display device, which are capable of simplifying the structure of the GOA circuits and realize a narrow bezel design of the display panel.

According to an aspect of embodiments of the present disclosure, there is provided a shift register, including:

an input sub-circuit connected to a signal input terminal, a first clock signal terminal and a pull-up node, and configured to provide a signal at the signal input terminal to the pull-up node under control of the first clock signal terminal;

an output sub-circuit connected to the pull-up node, a second clock signal terminal and a signal output terminal, and configured to provide a clock signal at the second clock signal terminal to the signal output terminal under control of the pull-up node; and a pull-down sub-circuit connected to the signal output terminal, a third clock signal terminal and a power supply terminal, and configured to provide a signal at the power supply terminal to the signal output terminal under control of the third clock signal terminal.

In an exemplary embodiment, the input sub-circuit includes a first transistor;

wherein a control electrode of the first transistor is connected to the first clock signal terminal, a first electrode of the first transistor is connected to the signal input terminal, and a second electrode of the first transistor is connected to the pull-up node.

In an exemplary embodiment, the output sub-circuit includes a second transistor and a capacitor;

wherein:

a control electrode of the second transistor is connected to the pull-up node, a first electrode of the second transistor is connected to the second clock signal terminal, and a second electrode of the second transistor is connected to the signal output terminal; and a first terminal of the capacitor is connected to the pull-up node, and a second terminal of the capacitor is connected to the signal output terminal.

In an exemplary embodiment, the pull-down sub-circuit includes a third transistor;

wherein a control electrode of the third transistor is connected to the third clock signal terminal, a first electrode of the third transistor is connected to the signal output terminal, and a second electrode of the third transistor is connected to the power supply terminal.

In an exemplary embodiment, the input sub-circuit includes a first transistor, the output sub-circuit includes a second transistor and a capacitor, and the pull-down sub-circuit includes a third transistor;

wherein:

a control electrode of the first transistor is connected to the first clock signal terminal, a first electrode of the first transistor is connected to the signal input terminal, and a second electrode of the first transistor is connected to a first terminal of the capacitor;

a control electrode of the second transistor is connected to the first terminal of the capacitor, a first electrode of the second transistor is connected to the second clock signal terminal, and a second electrode of the second transistor is connected to the signal output terminal;

a second terminal of the capacitor is connected to the signal output terminal; and a control electrode of the third transistor is connected to the third clock signal terminal, a first electrode of the third transistor is connected to the signal output terminal, and a second electrode of the third transistor is connected to the power supply terminal.

In an exemplary embodiment, the first transistor, the second transistor, and the third transistor are N-type thin film transistors or P-type thin film transistors.

According to another aspect of embodiments of the present disclosure, there is provided a gate driving circuit, including a plurality of cascaded shift registers as described above; wherein the gate driving circuit further includes a first clock signal source, a second clock signal source, a third clock signal source, a fourth clock signal source, a fifth clock signal source, and a sixth clock signal source;

wherein:

the signal input terminal of an N-th stage shift register is connected to the signal output terminal of an (N−1)-th stage shift register;

the first clock signal terminal of the (N−1)-th stage shift register is connected to the first clock signal source, the second clock signal terminal of the (N−1)-th stage shift register is connected to the second clock signal source, and the third clock signal terminal of the (N−1)-th stage shift register is connected to the fourth clock signal source;

the first clock signal terminal of the N-th stage shift register is connected to the second clock signal source, the second clock signal terminal of the N-th stage shift register is connected to the third clock signal source, and the third clock signal terminal of the N-th stage shift register is connected to the fifth clock signal source;

the first clock signal terminal of an (N+1)-th stage shift register is connected to the third clock signal source, the second clock signal terminal of the (N+1)-th stage shift register is connected to the first clock signal source, and the third clock signal terminal of the (N+1)-th stage shift register is connected to the sixth clock signal source.

In an exemplary embodiment, periods and duty ratios of signals of the first clock signal source, the second clock signal source, and the third clock signal source are equal, and periods and duty ratios of signals of the fourth clock signal source, the fifth clock signal source, and the sixth clock signal source are equal;

a period of the signal of the first clock signal source is equal to a period of the fourth clock signal source, and a duty ratio of the signal of the first clock signal source is greater than the duty ratio of the signal of the fourth clock signal source.

According to another aspect of embodiments of the present disclosure, there is provided a display device including the gate driving circuit as described above.

According to another aspect of embodiments of the present disclosure, there is provided a method for driving a shift register, which is applied to the shift register as described above, including:

in a reset stage, providing by the pull-down sub-circuit a signal at the power supply terminal to the signal output terminal under control of the third clock signal terminal;

in an input stage, providing by the input sub-circuit a signal at the input signal terminal to the pull-up node under control of the first clock signal terminal;

in an output stage, providing by the output sub-circuit a clock signal at the second clock signal terminal to the signal output terminal under control of the pull-up node; and in the pull-down stage, providing by the output sub-circuit a clock signal at the second clock signal terminal to the signal output terminal under control of the pull-up node, and providing by the pull-down sub-circuit the signal at the power supply terminal to the signal output terminal under control of the third clock signal terminal.

In an exemplary embodiment, the pull-down stage includes s a first pull-down sub-stage and a second pull-down sub-stage;

wherein:

in the first pull-down sub-stage, the output sub-circuit provides a clock signal at the second clock signal terminal to the signal output terminal under control of the pull-up node; and in the second pull-down sub-stage, the pull-down sub-circuit provides a signal at the power supply terminal to the signal output terminal under control of the third clock signal terminal.

Embodiments of the present disclosure provide a shift register and a driving method thereof, a gate driving circuit, and a display device. The shift register includes: an input sub-circuit connected to a signal input terminal, a first clock signal terminal and a pull-up node, and configured to provide a signal at the signal input terminal to the pull-up node under control of the first clock signal terminal; an output sub-circuit connected to the pull-up node, a second clock signal terminal and a signal output terminal, and configured to provide a clock signal at the second clock signal terminal to the signal output terminal under control of the pull-up node; and a pull-down sub-circuit connected to the signal output terminal, a third clock signal terminal and a power supply terminal, and configured to provide a signal at the power supply terminal to the signal output terminal under control of the third clock signal terminal. In the technical solutions provided by the present disclosure, the function of the shift register is realized by the cooperation of the input sub-circuit, the output sub-circuit and the pull-down sub-circuit, which simplifies the structure of the GOA circuit, and realizes the narrow bezel design of the display panel.

Of course, implementing any of the products or methods of the present disclosure does not necessarily require all of the advantages described above to be achieved at the same time. Other features and advantages of the present disclosure will be set forth in the descriptions below. The objectives and other advantages of the embodiments of the present disclosure can be realized and obtained by the structures particularly pointed out in the description, claims and drawings.

BRIEF DESCRIPTION OF THE DRAWINGS

The drawings are used to provide a further understanding of the technical solutions of the present disclosure, and constitute a part of the specification. The drawings along with the description serve to explain the technical solutions of the present disclosure and should not be construed as limiting the present disclosure.

DESCRIPTION OF THE REFERENCE SIGNS

INPUT: signal input terminal;
OUTPUT: signal output terminal;
CLK1: first clock signal terminal;
CLK2: second clock signal terminal;
CLK3: third clock signal terminal;
VSS: power supply terminal;
CLKA: first clock signal source;
CLKB: second clock signal source;
CLKC: third clock signal source;
CLKD: fourth clock signal source;
CLKE: fifth clock signal source;
CLKF: sixth clock signal source;
STV: initial signal terminal.

DETAILED DESCRIPTION

In order to make the objectives, technical solutions and advantages of the present disclosure more clear, embodiments of the present disclosure will be described in detail below with reference to the accompanying drawings. It should be noted that, features in the embodiments and the embodiments in the present disclosure may be arbitrarily combined with each other if the embodiments or features do not conflict with each other.

The steps illustrated in the flowcharts may be executed in a computer system with a set of computer executable instructions stored therein. Also, although logical sequences are shown in the flowcharts, in some cases the steps shown or described may be performed in a different order than the ones described herein.

Unless otherwise defined, technical terms or scientific terms used in embodiments of the present disclosure should be construed in the ordinary meaning of those of ordinary skill in the art. The terms "first", "second" and similar terms used in the embodiments of the present disclosure do not denote any order, quantity, or importance, but are merely used to distinguish different components. The word "including" or "comprising" and so on refers to that an element or component that appears before the word include the elements or components that appear after the word and equivalents thereof, without excluding other elements or components. The word "connected" or "coupled" and the like are not limited to physical or mechanical connections, but may include electrical connections, and the connections may be direct or indirect.

Those skilled in the art will appreciate that the transistors in all embodiments of the present disclosure may be thin film transistors or field effect transistors or other devices having the same characteristics. Preferably, the thin film transistors used in the embodiment of the present disclosure may be oxide semiconductor transistors. Since the source and drain of a transistor used here are symmetrical, the source and drain thereof can be interchanged. In the embodiment of the present disclosure, in order to distinguish the two electrodes of the switching transistor except the gate electrode, one of the electrodes is referred to as a first electrode, the other one is referred to as a second electrode, and the first electrode may be a source or a drain, and the second electrode can be a drain or source.

Figure 1:
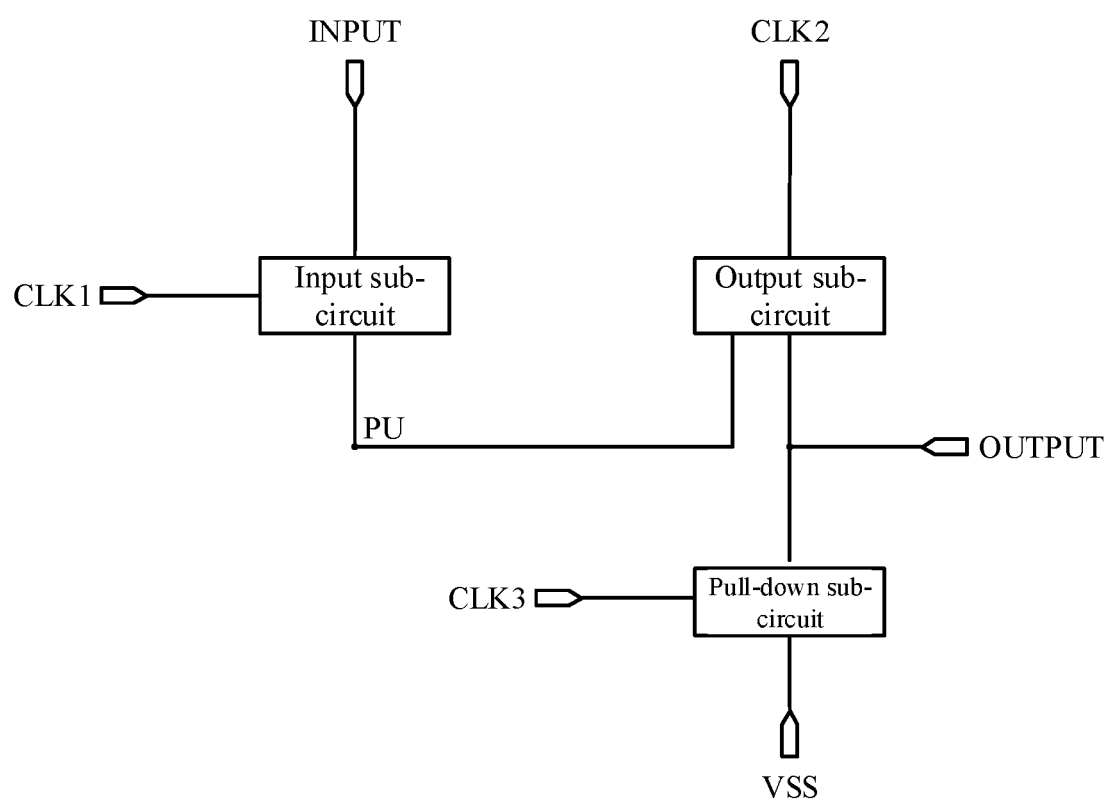
FIG. 1 is a schematic structural diagram of a shift register according to an embodiment of the present disclosure.

Some embodiments of the present disclosure provide a shift register. FIG. 1 is a schematic structural diagram of a shift register according to an embodiment of the present disclosure. As shown in FIG. 1, a shift register provided by an embodiment of the present disclosure includes: an input sub-circuit, an output sub-circuit and a pull-down sub-circuit.

Specifically, the input sub-circuit is connected to a signal input terminal INPUT, a first clock signal terminal CLK1 and a pull-up node PU, and is configured to provide a signal at the signal input terminal INPUT to the pull-up node PU under the control of the first clock signal terminal CLK1.

The output sub-circuit is connected to the pull-up node PU, a second clock signal terminal CLK2 and a signal output terminal OUTPUT, and is configured to provide a clock signal at the second clock signal terminal CLK2 to the signal output terminal OUTPUT under the control of the pull-up node PU.

The pull-down sub-circuit is connected to the signal output terminal OUTPUT, a third clock signal terminal CLK3 and a power supply terminal VSS for providing a signal of the power supply terminal VSS to the signal output terminal OUTPUT under the control of the third clock signal terminal CLK3.

Specifically, in the embodiment of the present disclosure, the period of the signal of the first clock signal terminal CLK1 and the period of the signal of the second clock signal terminal CLK2 are the same, and the duty ratio of the signal of the first clock signal terminal CLK1 and the duty ratio of the signal of the second clock signal terminal CLK2 are the same, both are ⅓. In the embodiment of the present disclosure, the power supply terminal VSS continues to provide a low level signal. In addition, the period of the signal of the third clock signal terminal CLK3 is the same as the period of the first clock signal terminal CLK1, and the duty ratio of the signal of the third clock signal terminal CLK3 is smaller than the duty ratio of the first clock signal terminal CLK1, that is, the pulse width of the signal of the three clock signal terminal CLK3 is smaller than the pulse width of the signal of the first clock signal terminal CLK1.

In addition, when the falling edge of the signal of the third clock signal terminal CLK3 is detected, the signal of the first clock signal terminal CLK1 starts to rise; and if the falling edge of the signal of the first clock signal terminal CLK1 is detected, the signal of the second clock signal terminal CLK2 starts to rise.

The shift register provided by the embodiment of the present disclosure includes: an input sub-circuit connected to a signal input terminal, a first clock signal terminal and a pull-up node, and configured to provide a signal at the signal input terminal to the pull-up node under control of the first clock signal terminal; an output sub-circuit connected to the pull-up node, a second clock signal terminal and a signal output terminal, and configured to provide a clock signal at the second clock signal terminal to the signal output terminal under control of the pull-up node; and a pull-down sub-circuit connected to the signal output terminal, a third clock signal terminal and a power supply terminal, and configured to provide a signal at the power supply terminal to the signal output terminal under control of the third clock signal terminal. In the technical solutions provided by the present disclosure, the function of the shift register is realized by the cooperation of the input sub-circuit, the output sub-circuit and the pull-down sub-circuit, which simplifies the structure of the GOA circuit, and realizes the narrow bezel design of the display panel.

Figure 2:
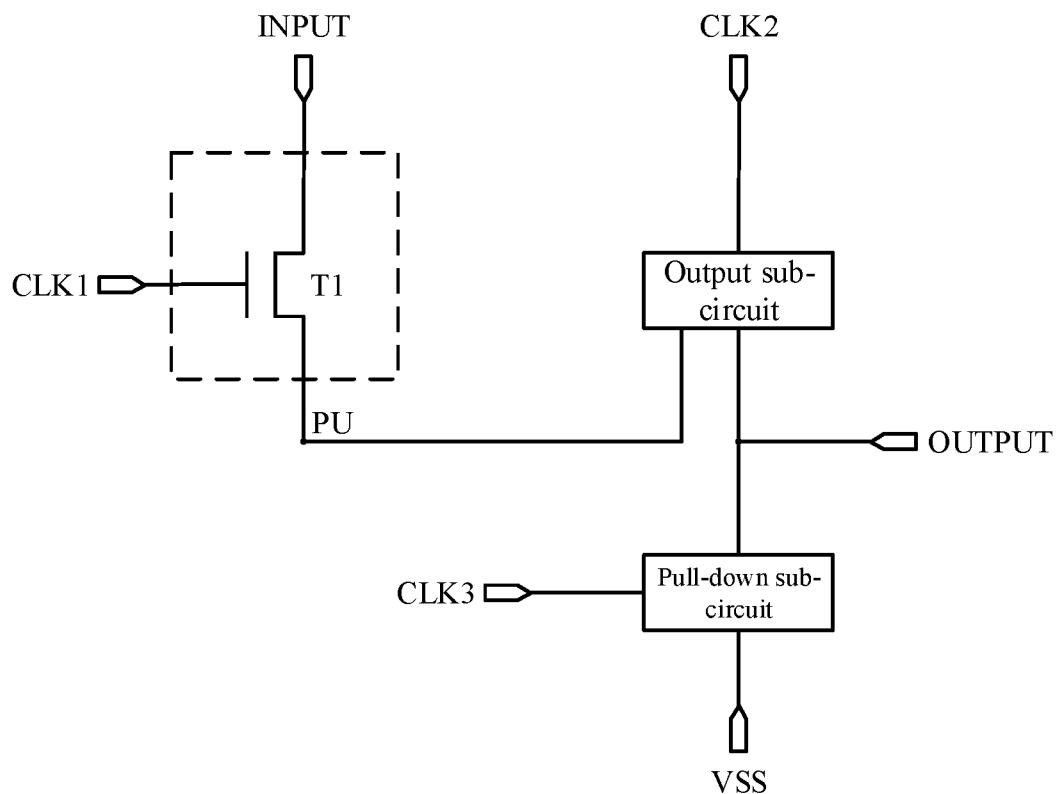
FIG. 2 is an equivalent circuit diagram of an input sub-circuit according to an embodiment of the present disclosure.

FIG. 2 is an equivalent circuit diagram of an input sub-circuit provided by an embodiment of the present disclosure. As shown in FIG. 2, the input sub-circuit includes a first transistor T1. A control electrode of the first transistor T1 is connected to a first clock signal terminal CLK1, a first electrode of the first transistor T1 is connected to the signal input terminal INPUT, and a second electrode of the first transistor T1 is connected to the pull-up node PU.

Specifically, when the first transistor T1 is turned on, the signal at the signal input terminal INPUT is provided to the pull-up node PU.

It should be noted that an exemplary structure of the input sub-circuit is specifically illustrated in FIG. 2. It will be readily understood by those skilled in the art that the implementation of the input sub-circuit is not limited thereto as long as the function can be realized.

Figure 3:
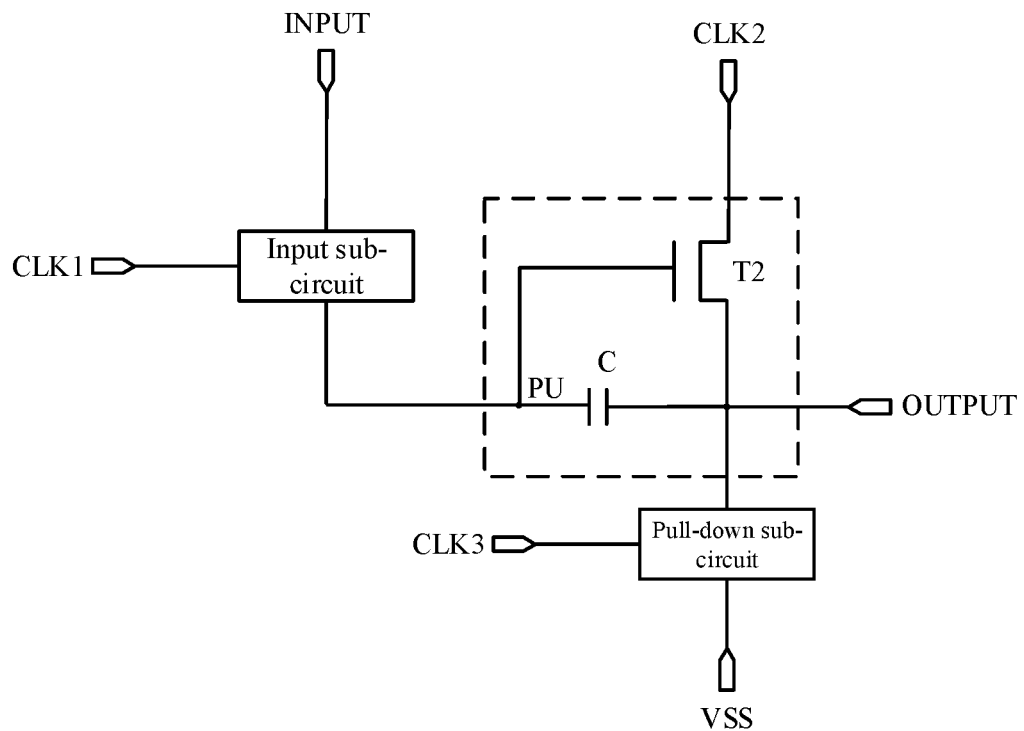
FIG. 3 is an equivalent circuit diagram of an output sub-circuit according to an embodiment of the present disclosure.

Optionally, FIG. 3 is an equivalent circuit diagram of an output sub-circuit provided by an embodiment of the present disclosure. As shown in FIG. 3, the output sub-circuit includes a second transistor T2 and a capacitor C. A control electrode of the second transistor T2 is connected to the pull-up node PU, a first electrode of second transistor T2 is connected to the second clock signal terminal CLK2, and a second electrode of second transistor T2 is connected to the signal output terminal OUTPUT. A first terminal of the capacitor C is connected to the pull-up node PU, and a second terminal of the capacitor C is connected to the signal output terminal OUTPUT.

Specifically, when the second transistor T2 is turned on, the signal at the second clock signal terminal CLK2 is supplied to the signal output terminal OUTPUT. When the signal at the second clock signal terminal CLK2 is at a low level, the output sub-circuit can also pull down the potential of the signal at the signal output terminal OUTPUT.

It should be noted that an exemplary structure of the input sub-circuit is specifically illustrated in FIG. 3. It will be readily understood by those skilled in the art that the implementation of the output sub-circuit is not limited thereto as long as the function can be realized.

Figure 4:
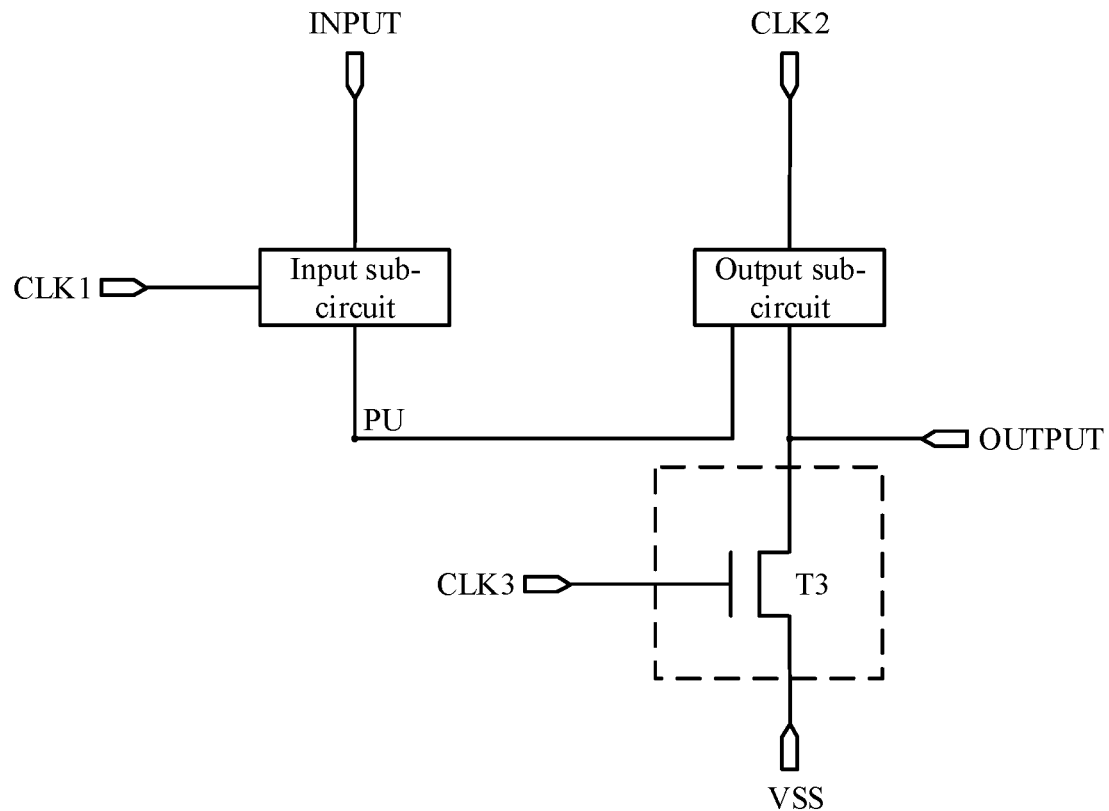
FIG. 4 is an equivalent circuit diagram of a pull-down sub-circuit according to an embodiment of the present disclosure.

Optionally, FIG. 4 is an equivalent circuit diagram of a pull-down sub-circuit provided by an embodiment of the present disclosure. As shown in FIG. 4, the pull-down sub-circuit includes a third transistor T3. A control electrode of the third transistor T3 is connected to the third clock signal terminal CLK3, a first electrode of the third transistor T3 is connected to the signal output terminal OUTPUT, and a second electrode of the third transistor T3 is connected to the power supply terminal VSS.

Specifically, when the third transistor T3 is turned on, the signal at the power terminal VSS is supplied to the signal output terminal OUTPUT. Since the power terminal continuously provides a low-level signal, when the third transistor T3 is turned on, the potential of the signal at the signal output terminal OUTPUT will be pulled down.

It should be noted that an exemplary structure of the pull-down sub-circuit is specifically illustrated in FIG. 4. It will be readily understood by those skilled in the art that the implementation of the pull-down sub-circuit is not limited thereto as long as its function can be realized.

Figure 5:
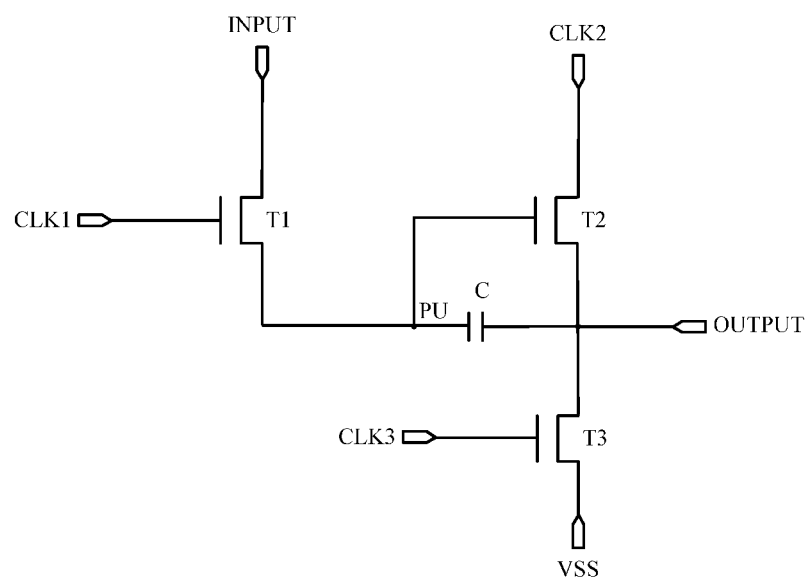
FIG. 5 is an equivalent circuit diagram of a shift register according to an embodiment of the present disclosure.

FIG. 5 is an equivalent circuit diagram of a shift register according to an embodiment of the present disclosure. FIG. 5 specifically shows an exemplary structure of an input sub-circuit, an output sub-circuit, and a pull-down sub-circuit. It will be readily understood by those skilled in the art that the implementation of the above sub-circuits is not limited thereto, as long as their respective functions can be realized.

Optionally, the input sub-circuit includes a first transistor T1, the output sub-circuit includes a second transistor T2 and a capacitor C, and the pull-down sub-circuit includes a third transistor T3. A control electrode of the first transistor T1 is connected to the first clock signal terminal CLK1, a first electrode of the first transistor T1 is connected to the signal input terminal INPUT, and a second electrode of the first transistor T1 is connected to the first terminal of the capacitor C. A control electrode of the second transistor T2 is connected to the first terminal of the capacitor C, a first electrode of the second transistor T2 is connected to the second clock signal terminal CLK2, and a second electrode of the second transistor T2 is connected to the signal output terminal OUTPUT. A second terminal of the capacitor C is connected to the signal output terminal OUTPUT. A control electrode of the third transistor T3 is connected with the third clock signal terminal CLK3, a first electrode of the third transistor T3 is connected to the signal output terminal OUTPUT, and a second electrode of the third transistor T3 is connected to the power supply terminal VSS.

In this embodiment, the transistors T1 to T3 can be N-type thin film transistors or P-type thin film transistors, which can unify the process flow, can reduce the processes, and help to improve the yield of the product. In addition, in view of the fact that the leakage current of low-temperature polysilicon thin film transistors is small, all the transistors in the embodiment of the present disclosure are preferably low-temperature polysilicon thin film transistors, and the thin film transistor may be thin film transistors having a bottom gate structure or thin film transistors having a top gate structure, as long as the switching function can be realized.

It should be noted that the capacitor C may be an equivalent capacitor formed by the gate of the second transistor T2 and the first electrode of the third transistor T3, which is not limited in the present disclosure.

The working process of the shift register will be described below.

Figure 6:
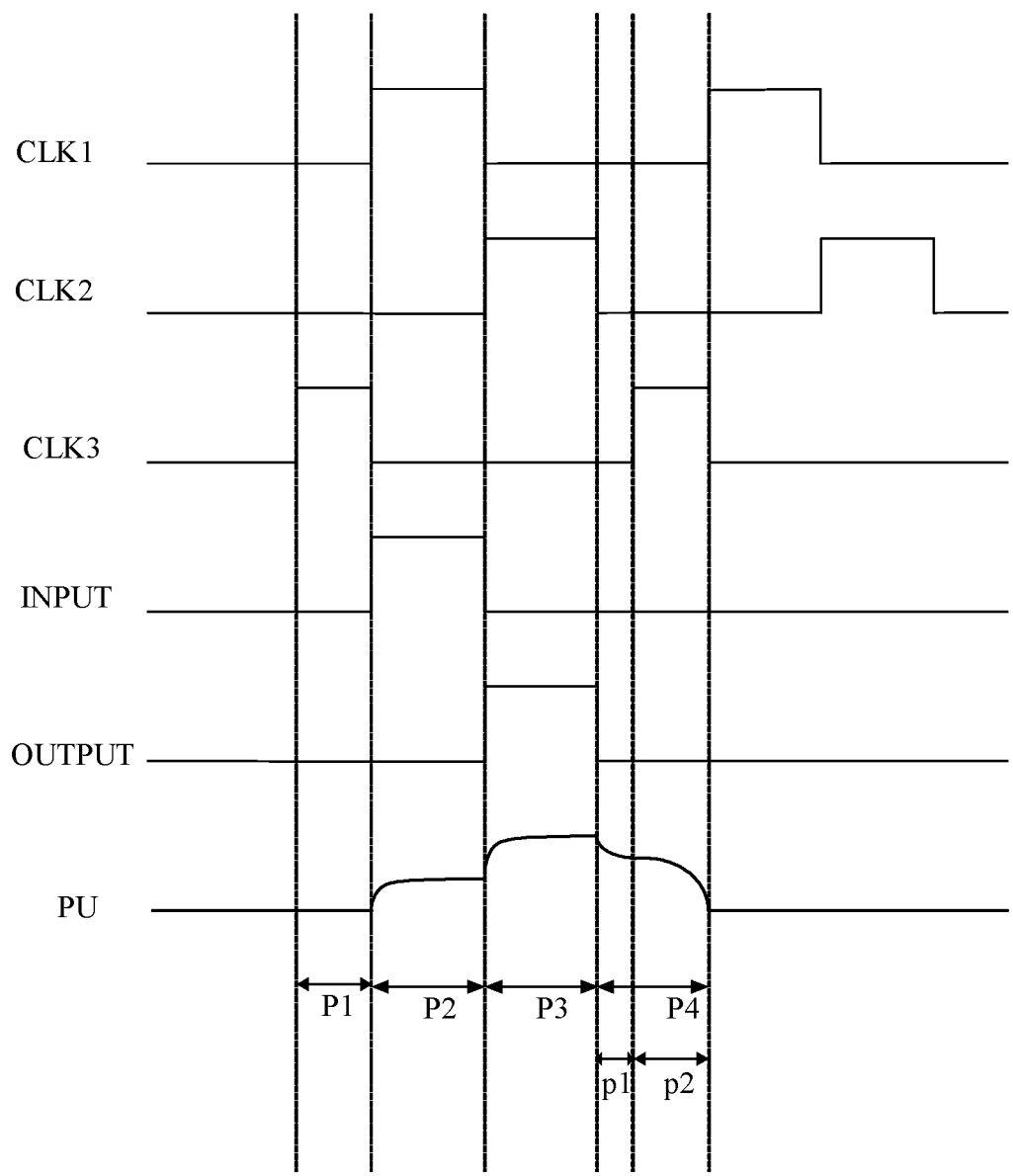
FIG. 6 is a timing chart of operation of a shift register according to an embodiment of the present disclosure.

In the description below, for example, the transistors T1 to T3 in the shift register provided by the embodiment of the present disclosure are all N-type thin film transistors. FIG. 6 is a timing chart of operation of the shift register according to the embodiment of the present disclosure. As shown in FIG. 5 and FIG. 6, the shift register provided by the embodiment of the present disclosure includes three transistor units (T1 to T3), one capacitor (C), four signal input terminals (INPUT, CLK1, CLK2, and CLK3), one signal output terminal (OUTPUT) and one power supply terminal (VSS).

The power supply terminal VSS continuously supplies a low level signal.

Specifically, in the first stage P1, that is, in the reset stage, the signal of the third clock signal terminal CLK3 is at a high level, the third transistor T3 is turned on, the potential of the signal of the signal output terminal OUTPUT is pulled down, and the potential at the node PU is pulled down by the function of the capacitor C.

In this stage, the signal of the third clock signal terminal CLK3 in the input terminal is at a high level, and the signals of the signal input terminal INPUT, the first clock signal terminal CLK1 and the second clock signal terminal CLK2 are at a low level, and the signal output by the signal output terminal OUTPUT is at a low level.

In the second stage P2, that is, in the input stage, the signals of the signal input terminal INPUT and the first clock signal terminal CLK1 are at a high level, and the first transistor T1 is turned on to pull up the potential of the pull-up node PU to charge the capacitor C.

In this stage, the signals of the signal input terminal INPUT and the first clock signal terminal CLK1 are at a high level, and the signals of the second clock signal terminal CLK2 and the second clock signal terminal CLK2 are both at a low level, and the output signal of the signal output terminal OUTPUT is at a low level. Although the potential of the pull-up node PU is at a high level and the second transistor T2 is turned on, the signal of the second clock signal terminal CLK2 is at a low level, and therefore the output signal of the signal output terminal OUTPUT is still at a low level.

In the third stage P3, that is, the output stage, the signal of the first clock signal terminal CLK1 is at a low level, and the first transistor T1 is turned off. Due to the bootstrap effect of the capacitor C, the potential of the pull-up node PU continues to be pulled up. The high level of the pull-up node PU causes the second transistor T2 to be turned on. Since the signal of the second clock signal terminal CLK2 becomes a high level, the signal output terminal OUTPUT outputs the signal at the second clock signal terminal CLK2, that is, the gate driving signal of the current stage. In addition, the rise of the potential of the pull-up node improves the conduction capability of the second transistor T2, and ensures charging of the pixel.

In this stage, the signal of the second clock signal terminal CLK2 in the input terminal is at a high level, and the signals of the signal input terminal INPUT, the first clock signal terminal CLK1 and the third clock signal terminal CLK3 are all at a low level, and the output signal of the signal output terminal OUTPUT is at a high level.

The fourth stage P4, that is, the pull-down stage, includes two stages: a first pull-down sub-stage p1 and a second pull-down sub-stage p2.

In the first pull-down sub-stage p1, the signal of the second clock signal terminal CLK2 is at a low level. At this time, the pull-up node PU is still at a high level, and the second transistor T2 is turned on. When the falling edge of the signal of the second clock signal terminal CLK2 is detected, the signal of the signal output terminal OUTPUT is instantaneously pulled down, and the potential of the pull-up node PU is pulled down by the action of the capacitor C.

In this stage, the signal input terminal INPUT, the first clock signal terminal CLK1, the second clock signal terminal CLK2, and the third clock signal terminal CLK3 in the input terminal are all a low level, and the output signal of the signal output terminal OUTPUT is at a low level. At this time, due to the relationship between the first capacitor C and the capacitance of the transistor itself, the potential of the pull-up node PU gradually decreases. Since the signal of the second clock signal terminal CLK2 is at a low level, the potential of the signal output terminal OUTPUT is pulled down to a low level, thereby reducing noise.

In the second pull-down sub-stage p2, the signal of the third clock signal terminal CLK3 is at a high level, the third transistor T3 is turned on, the potential of the signal at the signal output terminal OUTPUT is pulled down, and the potential of the pull-up node PU is also pulled down under the action of the capacitor C.

In this stage, the signal of the third clock signal terminal CLK3 in the input terminal is at a high level, and the signals of the signal input terminal INPUT, the first clock signal terminal CLK1 and the second clock signal terminal CLK2 are all at a low level, and the output signal of the signal output terminal OUTPUT is at a low level. At this time, due to the relationship between the capacitance C and the capacitance of the transistor itself, the potential of the pull-up node PU gradually decreases, thereby reducing noise.

In all stages, the signal at the power supply VSS keeps at a low level.

After the second pull-down sub-stage, the shift register of this stage remains in a hold stage until the signal input terminal INPUT of the current stage shift register receives a high level signal.

In this embodiment, the signal of the signal input terminal INPUT is a pulse signal, which is only at a high level in the input stage. The output signal of the signal output terminal OUTPUT is a pulse signal, which is only at a high level in the output stage. The signals of the first clock signal terminal CLK1, the second clock signal terminal CLK2, and the third clock signal terminal CLK3 are periodic signals.

In this embodiment, the output sub-circuit can not only raise the potential of the pull-up node PU, but also cause the signal output terminal OUTPUT to output the gate driving signal of the current stage. Also, once the potential of the signal of the second clock signal terminal CLK2 decreases, the output sub-circuit can instantly pull down the potential of the output signal, reduce the falling edge of the output signal, and thus avoid the false output caused by the falling edge and ensure the working stability, reliability and display effect of the display panel.

Figure 7:
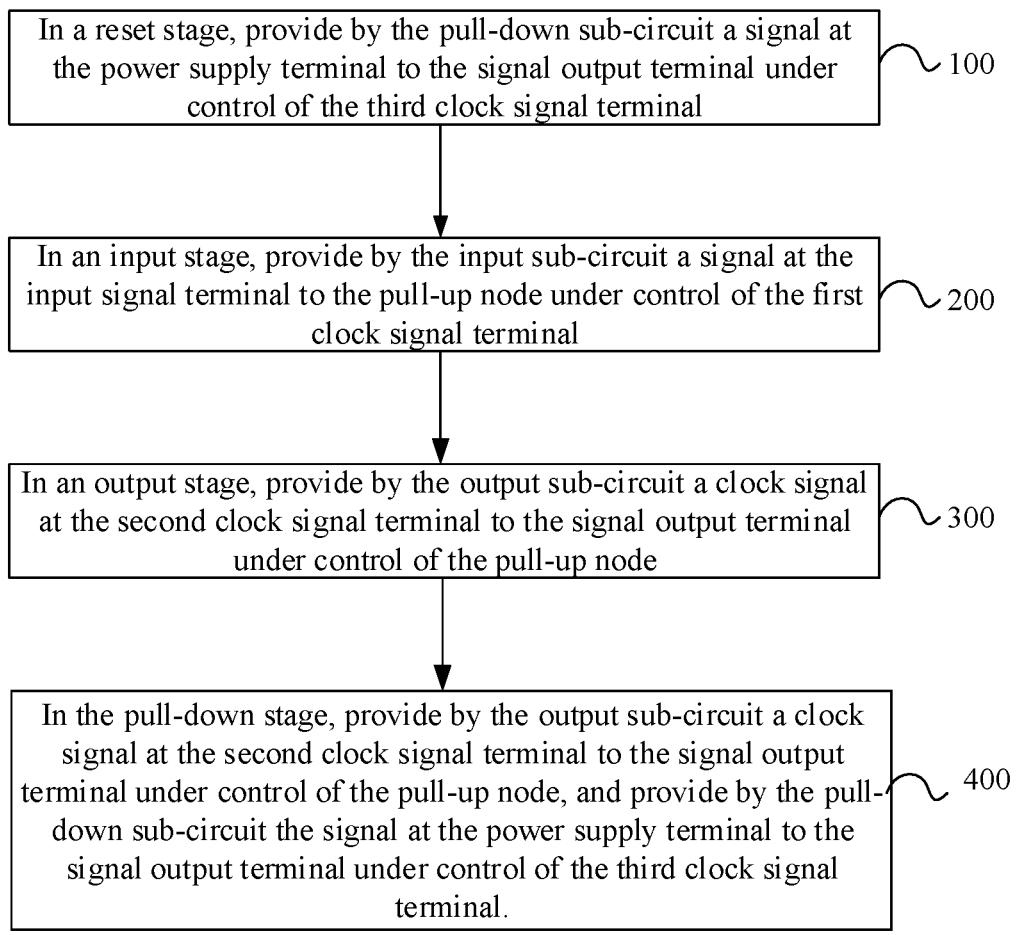
FIG. 7 is a flowchart of a method for driving a shift register according to an embodiment of the present disclosure.

Based on the inventive concept of the above embodiments, some embodiments of the present disclosure further provide a method for driving a shift register, which is applied to the shift register provided by the above embodiment. The shift register includes the input sub-circuit, the output sub-circuit and the pull-down sub-circuit, further includes the signal input terminal, the first clock signal terminal, the second clock signal terminal, the third clock signal terminal and the signal output terminal. FIG. 7 is a flowchart showing a driving method of the shift register according to an embodiment of the present disclosure. As shown in FIG. 7, the driving method for the shift register provided by the embodiment of the present disclosure specifically includes the following steps:

In step 100, in the reset stage, the pull-down sub-circuit provides the signal at the power supply terminal to the signal output terminal under the control of the third clock signal terminal.

Specifically, the signal at the power terminal continues to be at a low level. In step 100, the pull-down sub-circuit pulls down the potential of the output signal at the signal output terminal.

In step 200, in the input stage, the input sub-circuit provides the signal at the input signal terminal to the pull-up node under the control of the first clock signal terminal.

Specifically, the signal at the signal input terminal is a pulse signal. In step 200, the signal at the signal input terminal is at a high level, and the input sub-circuit increases the potential of the pull-up node.

In step 300, in the output stage, the output sub-circuit provides the clock signal at the second clock signal terminal to the signal output terminal under the control of the pull-up node.

Specifically, under the bootstrap effect of the capacitor, the potential of the pull-up node is further increased, the signal at the second clock signal terminal is at a high level, and the output signal of the signal output terminal is at a high level.

In step 400, in the pull-down stage, the output sub-circuit provides the clock signal at the second clock signal terminal to the signal output terminal under the control of the pull-up node, and the pull-down sub-circuit provides the signal at the power supply terminal to the signal output terminal under the control of the third clock signal terminal.

Specifically, the pull-down stage includes a first pull-down sub-stage and a second pull-down sub-stage. In the first pull-down sub-stage, the output sub-circuit provides the clock signal at the second clock signal terminal to the signal output terminal under the control of the pull-up node. In the second pull-down sub-stage, the pull-down sub-circuit provides the signal at the power supply terminal to the signal output terminal under the control of the third clock signal terminal.

In this embodiment, once the potential of the signal at the second clock signal terminal is decreased, the output signal at the signal output terminal can be immediately pulled-down in the first pull-down sub-stage, thereby reducing the falling edge of the output signal, and avoiding the wrong output due to the falling edge. Accordingly, the present disclosure can ensure the working stability, reliability and display effect of the display panel. In addition, the potential of the pull-up node is also lowered, thereby reducing noise.

The method for driving the shift register provided by the embodiment of the present disclosure includes the following steps. In the reset stage, the pull-down sub-circuit provides a signal at the power supply terminal to the signal output terminal under control of the third clock signal terminal. In the input stage, the input sub-circuit a signal at the input signal terminal to the pull-up node under control of the first clock signal terminal. In an output stage, the output sub-circuit provides a clock signal at the second clock signal terminal to the signal output terminal under control of the pull-up node. In the pull-down stage, the output sub-circuit provide a clock signal at the second clock signal terminal to the signal output terminal under control of the pull-up node, and the pull-down sub-circuit provides the signal at the power supply terminal to the signal output terminal under control of the third clock signal terminal. The technical solutions provided by the present disclosure realizes the function of the shift register by the cooperation of the input sub-circuit, the output sub-circuit and the pull-down sub-circuit, simplifies the structure of the GOA circuit, and realizes the narrow bezel design of the display panel.

Figure 8:
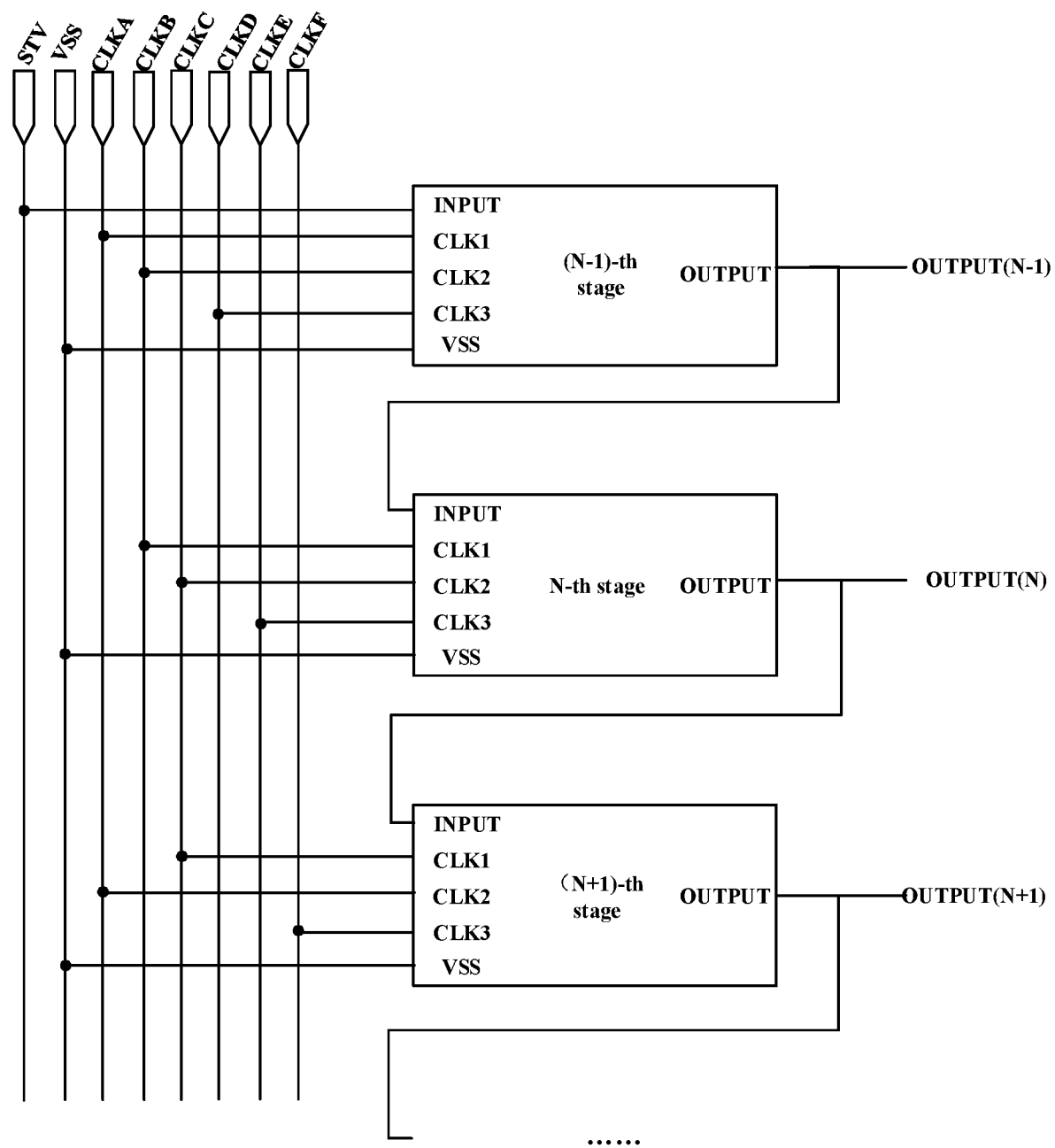
FIG. 8 is a schematic structural diagram of a gate driving circuit according to an embodiment of the present disclosure.
Figure 9:
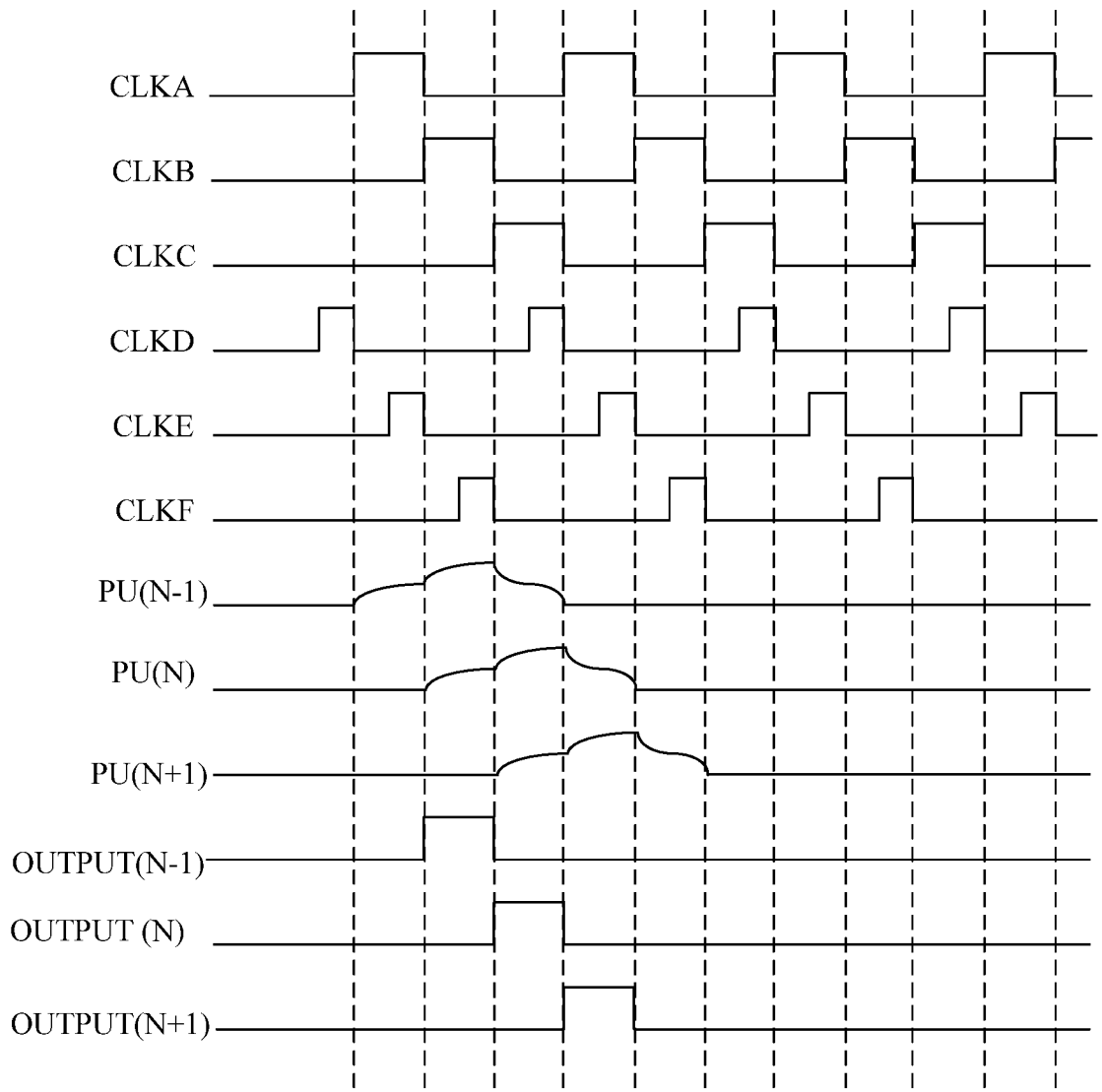
FIG. 9 is a timing chart of operation of a gate driving circuit according to an embodiment of the present disclosure.

Based on the inventive concept of the foregoing embodiments, some embodiments of the present disclosure further provide a gate driving circuit. FIG. 8 is a schematic structural diagram of a gate driving circuit according to an embodiment of the present disclosure, and FIG. 9 is a timing chart of operation of a gate driving circuit according to an embodiment of the present disclosure. As shown in FIG. 8 and FIG. 9, the gate driving circuit provided by the embodiment of the present disclosure includes: a plurality of cascaded shift registers provided in the first embodiment. The gate driving circuit further includes a first clock signal source CLKA, a second clock signal source CLKB, a third clock signal source CLKC, a fourth clock signal source CLKD, a fifth clock signal source CLKE, and a sixth clock signal source CLKF.

Specifically, the signal input terminal INPUT of the N-th stage shift register is connected to the signal output terminal OUTPUT of the (N−1)-th stage shift register. The first clock signal terminal CLK1 of the (N−1)-th stage shift register is connected to the first clock signal source CLKA. The second clock signal terminal CLK2 of the (N−1)-th stage shift register is connected to the second clock signal source CLKB. The third clock signal terminal CLK3 of the (N−1)-th stage shift register is connected to the fourth clock signal source CLKD. The first clock signal terminal CLK1 of the N-th stage shift register is connected to the second clock signal source CLKB. The second clock signal terminal CLK2 of the N-th stage shift register is connected to the third clock signal source CLKC. The third clock signal terminal CLK3 of the N-th stage shift register is connected to the fifth clock signal source CLKE. The first clock signal terminal CLK1 of the (N+1)-th stage shift register is connected to is connected to the third clock signal source CLKC. The second clock signal terminal CLK2 of the (N+1)-th stage shift register is connected to the first clock signal source CLKA. The third clock signal terminal CLK3 of the (N+1)-th stage shift register is connected to the sixth clock signal source CLKF. It should be noted that each three-stage shift register is a loop, that is, the connection relationship between clock signal terminals and respective clock signal sources in the (N+2)-th shift register is the same as that in the (N−1)-th shift register, the connection relationship between clock signal terminals and respective clock signal sources in the (N+3)-th stage shift register is the same as that in the N-th stage shift register, and the connection relationship between clock signal terminals and respective clock signal sources in the (N+4)-th stage shift register is the same as that in the (N+1)-th stage shift register, and so on.

In addition, the gate driving circuit further includes an initial signal terminal STV (Start Vertical) and a power supply VS. The signal input terminal of the first electrode shift register is connected to the initial signal terminal STV, and the power supply terminal VSS of each stage shift register is connected to the power source VS.

According to an exemplary embodiment, the periods and duty ratios of the signals of the first clock signal source CLKA, the second clock signal source CLKB, and the third clock signal source CLKC are equal. Periods and duty ratios of signals of the fourth clock signal source CLKD, the fifth clock signal source CLKE, and the sixth clock signal source CLKF are equal. The period of the signal of the first clock signal source CLKA is equal to the period of the fourth clock signal source CLKD, and the duty ratio of the signal of the first clock signal source CLKA is greater than the duty ratio of the signal of the fourth clock signal source CLKD, that is, the pulse width of the signal of the fourth clock signal source CLKD is smaller than the pulse width of the signal of the first clock signal source CLKA.

In this embodiment, if the falling edge of the signal of the fourth clock signal source CLKD is detected, the signal of the first clock signal source CLKA starts to rise. If the falling edge of the signal of the first clock signal source CLKA is detected, the signal of the second clock signal source CLKB starts to rise. If the falling edge of the signal of the second clock signal source CLKB is detected, the signal of the third clock signal source CLKC starts to rise. If the falling edge of the signal of the third clock signal source CLKC is detected, the signal of the first clock signal source CLKA starts to rise. In addition, if the falling edge of the signal of the fifth clock signal source CLKE is detected, the signal of the second clock signal source CLKB starts to rise. If the falling edge of the signal of the sixth clock signal source CLKF is detected, the third clock signal source of the CLKC signal begins to rise.

Based on the inventive concept of the foregoing embodiments, an embodiment of the present disclosure further provides a display device including a gate driving circuit.

The gate driving circuit is the gate driving circuit provided by the foregoing embodiments, and the implementation principle and technical effects thereof are similar, and details are not described herein again.

There are a few points to note:

The drawings only show the structures which are involved in the present disclosure, and other structures which are not described in detail can be found in common design.

Embodiments and features in connection with embodiments may be combined with each other if these embodiments and features do not conflict with each other.

While the embodiments of the present disclosure have been described above, the described embodiments are merely for the purpose of understanding the present disclosure and are not intended to limit the present disclosure. Any modification and variation in the form and details of the embodiments may be made by those skilled in the art without departing from the spirit and scope of the present disclosure. The scope of the present disclosure is defined by the appended claims.

What is claimed is:
1. A shift register, comprising:
an input sub-circuit connected to a signal input terminal, a first clock signal terminal and a pull-up node, and configured to provide a signal at the signal input terminal to the pull-up node under control of the first clock signal terminal;

an output sub-circuit connected to the pull-up node, a second clock signal terminal and a signal output terminal, and configured to provide a clock signal at the second clock signal terminal to the signal output terminal under control of the pull-up node to pull down a potential of a signal output by the signal output terminal by a low level of the lock signal at the second clock signal terminal; and a pull-down sub-circuit connected to the signal output terminal, a third clock signal terminal and a power supply terminal, and configured to provide a signal at the power supply terminal to the signal output terminal under control of the third clock signal terminal to pull down the potential of the signal output by the signal output terminal by a low level of the power signal at the power supply terminal.

2. The shift register according to claim 1, wherein the input sub-circuit comprises a first transistor;
wherein a control electrode of the first transistor is connected to the first clock signal terminal, a first electrode of the first transistor is connected to the signal input terminal, and a second electrode of the first transistor is connected to the pull-up node.

3. The shift register according to claim 1, wherein the output sub-circuit comprises a second transistor and a capacitor;
wherein:
a control electrode of the second transistor is connected to the pull-up node, a first electrode of the second transistor is connected to the second clock signal terminal, and a second electrode of the second transistor is connected to the signal output terminal; and
a first terminal of the capacitor is connected to the pull-up node, and a second terminal of the capacitor is connected to the signal output terminal.

4. The shift register according to claim 1, wherein the pull-down sub-circuit comprises a third transistor;
wherein a control electrode of the third transistor is connected to the third clock signal terminal, a first electrode of the third transistor is connected to the signal output terminal, and a second electrode of the third transistor is connected to the power supply terminal.

5. The shift register according to claim 1, wherein the input sub-circuit comprise a first transistor, the output sub-circuit comprises a second transistor and a capacitor, and the pull-down sub-circuit comprises a third transistor;
wherein:
a control electrode of the first transistor is connected to the first clock signal terminal, a first electrode of the first transistor is connected to the signal input terminal, and a second electrode of the first transistor is connected to a first terminal of the capacitor;
a control electrode of the second transistor is connected to the first terminal of the capacitor, a first electrode of the second transistor is connected to the second clock signal terminal, and a second electrode of the second transistor is connected to the signal output terminal;
a second terminal of the capacitor is connected to the signal output terminal; and
a control electrode of the third transistor is connected to the third clock signal terminal, a first electrode of the third transistor is connected to the signal output terminal, and a second electrode of the third transistor is connected to the power supply terminal.

6. The shift register according to claim 5, wherein the first transistor, the second transistor, and the third transistor are N-type thin film transistors or P-type thin film transistors.

7. A gate driving circuit, comprising a plurality of cascaded shift registers;
wherein each of the shift registers comprises an input sub-circuit connected to a signal input terminal, a first clock signal terminal and a pull-up node, and configured to provide a signal at the signal input terminal to the pull-up node under control of the first clock signal terminal;
an output sub-circuit connected to the pull-up node, a second clock signal terminal and a signal output terminal, and configured to provide a clock signal at the second clock signal terminal to the signal output terminal under control of the pull-up node; and
a pull-down sub-circuit connected to the signal output terminal, a third clock signal terminal and a power supply terminal, and configured to provide a signal at the power supply terminal to the signal output terminal under control of the third clock signal terminal;
wherein the gate driving circuit further comprises a first clock signal source, a second clock signal source, a third clock signal source, a fourth clock signal source, a fifth clock signal source, and a sixth clock signal source;
wherein:
a signal input terminal of an N-th stage shift register is connected to a signal output terminal of an (N−1)-th stage shift register;
a first clock signal terminal of the (N−1)-th stage shift register is connected to the first clock signal source, a second clock signal terminal of the (N−1)-th stage shift register is connected to the second clock signal source, and a third clock signal terminal of the (N−1)-th stage shift register is connected to the fourth clock signal source;
a first clock signal terminal of the N-th stage shift register is connected to the second clock signal source, a second clock signal terminal of the N-th stage shift register is connected to the third clock signal source, and a third clock signal terminal of the N-th stage shift register is connected to the fifth clock signal source; and
a first clock signal terminal of an (N+1)-th stage shift register is connected to the third clock signal source, a second clock signal terminal of the (N+1)-th stage shift register is connected to the first clock signal source, and a third clock signal terminal of the (N+1)-th stage shift register is connected to the sixth clock signal source.

8. The gate driving circuit according to claim 7, wherein:
periods and duty ratios of signals of the first clock signal source, the second clock signal source, and the third clock signal source are equal, and periods and duty ratios of signals of the fourth clock signal source, the fifth clock signal source, and the sixth clock signal source are equal; and
a period of the signal of the first clock signal source is equal to a period of the fourth clock signal source, and a duty ratio of the signal of the first clock signal source is greater than the duty ratio of the signal of the fourth clock signal source.

9. The gate driving circuit according to claim 7, wherein the input sub-circuit comprises a first transistor;
wherein a control electrode of the first transistor is connected to the first clock signal terminal, a first electrode of the first transistor is connected to the signal input terminal, and a second electrode of the first transistor is connected to the pull-up node.

10. The gate driving circuit according to claim 7, wherein the output sub-circuit comprises a second transistor and a capacitor;
wherein:
a control electrode of the second transistor is connected to the pull-up node, a first electrode of the second transistor is connected to the second clock signal terminal, and a second electrode of the second transistor is connected to the signal output terminal; and
a first terminal of the capacitor is connected to the pull-up node, and a second terminal of the capacitor is connected to the signal output terminal.

11. The gate driving circuit according to claim 7, wherein the pull-down sub-circuit comprises a third transistor;
wherein a control electrode of the third transistor is connected to the third clock signal terminal, a first electrode of the third transistor is connected to the signal output terminal, and a second electrode of the third transistor is connected to the power supply terminal.

12. The gate driving circuit according to claim 7, wherein the input sub-circuit comprise a first transistor, the output sub-circuit comprises a second transistor and a capacitor, and the pull-down sub-circuit comprises a third transistor;
wherein:
a control electrode of the first transistor is connected to the first clock signal terminal, a first electrode of the first transistor is connected to the signal input terminal, and a second electrode of the first transistor is connected to a first terminal of the capacitor;
a control electrode of the second transistor is connected to the first terminal of the capacitor, a first electrode of the second transistor is connected to the second clock signal terminal, and a second electrode of the second transistor is connected to the signal output terminal;
a second terminal of the capacitor is connected to the signal output terminal; and
a control electrode of the third transistor is connected to the third clock signal terminal, a first electrode of the third transistor is connected to the signal output terminal, and a second electrode of the third transistor is connected to the power supply terminal.

13. The gate driving circuit according to claim 12, wherein the first transistor, the second transistor, and the third transistor are N-type thin film transistors or P-type thin film transistors.

14. A display device comprising the gate driving circuit according to claim 7.

15. A method for driving a shift register, wherein the shift register comprises:

an input sub-circuit connected to a signal input terminal, a first clock signal terminal and a pull-up node, and configured to provide a signal at the signal input terminal to the pull-up node under control of the first clock signal terminal;
an output sub-circuit connected to the pull-up node, a second clock signal terminal and a signal output terminal, and configured to provide a clock signal at the second clock signal terminal to the signal output terminal under control of the pull-up node; and
a pull-down sub-circuit connected to the signal output terminal, a third clock signal terminal and a power supply terminal, and configured to provide a signal at the power supply terminal to the signal output terminal under control of the third clock signal terminal:
wherein the method comprises:
in a reset stage, providing by the pull-down sub-circuit a signal at the power supply terminal to the signal output terminal under control of the third clock signal terminal;
in an input stage, providing by the input sub-circuit a signal at the input signal terminal to the pull-up node under control of the first clock signal terminal;
in an output stage, providing by the output sub-circuit a clock signal at the second clock signal terminal to the signal output terminal under control of the pull-up node; and
in the pull-down stage, providing by the output sub-circuit a clock signal at the second clock signal terminal to the signal output terminal under control of the pull-up node, and providing by the pull-down sub-circuit the signal at the power supply terminal to the signal output terminal under control of the third clock signal terminal.

16. The method according to claim 15, wherein the pull-down stage comprises a first pull-down sub-stage and a second pull-down sub-stage;
wherein:
in the first pull-down sub-stage, the output sub-circuit provides a clock signal at the second clock signal terminal to the signal output terminal under control of the pull-up node to pull down a potential of a signal output by the signal output terminal by a low level of the lock signal at the second clock signal terminal; and
in the second pull-down sub-stage, the pull-down sub-circuit provides a signal at the power supply terminal to the signal output terminal under control of the third clock signal terminal to pull down the potential of the signal output by the signal output terminal by a low level of the power signal at the power supply terminal.

* * * * *